(12) United States Patent
Gau et al.

(10) Patent No.: US 7,279,267 B2
(45) Date of Patent: Oct. 9, 2007

(54) METHOD FOR MANIPULATING THE TOPOGRAPHY OF A FILM SURFACE

(75) Inventors: Tsai-Sheng Gau, Hsin-Chu (TW); Burn Jeng Lin, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 350 days.

(21) Appl. No.: 10/644,356

(22) Filed: Aug. 19, 2003

(65) Prior Publication Data

US 2005/0042552 A1    Feb. 24, 2005

(51) Int. Cl.
*G03F 7/26* (2006.01)

(52) U.S. Cl. .......................................... 430/311; 430/30

(58) Field of Classification Search ................ 430/322, 430/311, 323
See application file for complete search history.

(56) References Cited

U.S. PATENT DOCUMENTS

| | | | | |
|---|---|---|---|---|
| 3,889,355 A | * | 6/1975 | Aronstein et al. ......... | 29/25.01 |
| 4,333,794 A | * | 6/1982 | Beyer et al. ................ | 438/427 |
| 4,822,722 A | * | 4/1989 | Lewis et al. ................ | 430/326 |
| 6,064,466 A | * | 5/2000 | Sato et al. .................... | 355/53 |

\* cited by examiner

*Primary Examiner*—Kathleen Duda
(74) *Attorney, Agent, or Firm*—Tung & Associates

(57) ABSTRACT

A method for selectively altering a thickness of a radiation sensitive polymer layer including providing a substrate including at least one radiation sensitive polymer layer having a first thickness topography; exposing the at least one radiation sensitive polymer layer through a mask having a predetermined radiant energy transmittance distribution to selectively expose predetermined areas of the at least one sensitive polymer layer to predetermined radiant energy dosages; and, developing the at least one radiation sensitive polymer layer to alter the first thickness topography of the at least one radiation sensitive polymer layer to produce a second thickness topography.

24 Claims, 3 Drawing Sheets

METHOD FOR MANIPULATING THE TOPOGRAPHY OF A FILM SURFACE

FIELD OF THE INVENTION

This invention generally relates to methods for achieving planar layers (films) in an integrated circuit containing semiconductor device and more particularly to a method manipulating the topography of a radiation sensitive polymer layer including a photosensitive polymer layer such as a photoresist.

BACKGROUND OF THE INVENTION

Surface topography in semiconductor integrated circuit manufacturing is increasingly important in the manufacture of multi-level semiconductor devices. The degree of planarization of a surface is recognized to be important in the patterning of subsequently formed features since the increasingly small critical dimensions require substantially planar surface to accurately transfer patterned features within design tolerances through a mask or reticle by passing radiation through the mask to a radiation sensitive surface such as a photoresist. The non-planarity of the surface is frequently magnified in subsequent material layer formation and photo-patterning processes.

For example, when depositing a polymeric layer of material, including a photoresist, the polymer is generally blanket deposited reflecting a topography in the deposited layer including protruding features on the surface such as metal lines or gate electrodes as well as penetrating features such as trench lines openings and Via openings.

Referring to FIG. 1A is shown an example of the effect that penetrating features such as Via openings have on material deposition. For example, Via openings 16A, 16B, 16C, and 16D are shown formed in a dielectric layer 15 in a portion of the process wafer substrate 17A having a relatively high density of Via opening features. In contrast, Via 16E is shown in a portion of the process wafer substrate 17B, separated in space from wafer portion 17A as indicated by lines e.g., 12, having a relatively low density of Via opening features. In prior art processes form forming dual damascene features, for example in a Via first process, a Via opening is first created followed by deposition and etchback of a polymeric layer e.g., 18, to a level where the polymer partially fills the Via opening to protect the Via in a subsequent trench etching process where an overlying trench opening encompassing one or more Vias is etched to form a dual damascene structure. In the process of depositing a layer of material, for example a polymeric layer 18 over the Via openings, the relatively higher density of the Via opening features in portion 17B of the process wafer substrate consumes a relatively larger portion of the deposited polymer, resulting in a relatively thinner polymer layer 18 overlying the Via openings in contrast with portion 17B having relatively fewer Via openings and producing in a relatively thicker polymer layer 18 over the feature opening e.g., 16E.

Referring to FIG. 1B, subsequently, in an etchback process, the etch back process produces polymer plugs e.g., 18A, 18B, 18C, 18D respectively filling varying portions of the Vias e.g., 16A, 16B, 16C, 16D which may vary in plug height among each other and be significantly different with respect to plug heights e.g., 18E filling Vias e.g., 16E in relatively less dense areas of the process wafer e.g., 17B. As a result of the nonuniform plug heights partially filling the Vias, a subsequent etching step to form the trench portion of a dual damascene structure will result in exposure of an intervening etch stop layer providing inadequate Via protection in the etching process or the formation of polymeric etching residues forming a Via fence at an upper portion of the plug. In particular, high aspect ratio Vias require uniform etching profiles including preventing formation of unetched residues around the Via openings during anisotropic etching of an overlying trench structure in a dual damascene formation process. The formation of Via fences detrimentally affect subsequent processes including adhesion/barrier layer deposition and metal filling deposition frequently resulting in degraded device performance including electrical pathway open circuits. Consequently, time consuming and complicated additional etching processes are required to remove the Via fence or otherwise adjust the Via etching profile increasing processing costs and reducing throughput.

There is therefore a need in the semiconductor processing art to develop a method to reliably manipulate the topography of radiation sensitive polymeric containing layers including improving a planarity to improve subsequent processes including lithographic and etchback processes to achieve improved device reliability and electrical performance while reducing processing costs.

It is therefore an object of the invention to provide a method to reliably manipulate the topography of radiation sensitive polymeric containing layers including improving a planarity to improve subsequent processes including lithographic and etchback processes to achieve improved device reliability and electrical performance while reducing processing costs in addition to overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for selectively altering a thickness of a radiation sensitive polymer layer.

According to a first embodiment, the method includes providing a substrate including at least one radiation sensitive polymer layer having a first thickness topography; exposing the at least one radiation sensitive polymer layer through a mask having a predetermined radiant energy transmittance distribution to selectively expose predetermined areas of the at least one sensitive polymer layer to predetermined radiant energy dosages; and, developing the at least one radiation sensitive polymer layer to alter the first thickness topography of the at least one radiation sensitive polymer layer to produce a second thickness topography.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

Although the method of the present invention is explained by exemplary reference the formation of a Via-first method of formation of a dual damascene structure in a multi-level semiconductor device, it will be appreciated that the method of the present invention is equally applicable to any microfabrication manufacturing process where the topography of a radiation sensitive polymeric layer may be advantageously manipulated including improving a surface planarity of the polymeric layer over a substrate. By the term "radiation sensitive polymeric layer" is mean any polymeric material that may be altered by radiation including photons and electrons to alter a structure of the polymeric material and thereby alter a layer thickness changing rate (material removal rate) of the polymeric layer by a layer thickness altering process including chemical dissolution, ablation, vaporization, and thermal heating. Although the method of the present invention is particularly advantageous in the formation of dual damascene structures, for example a copper filled dual damascene structure formed in a low dielectric constant (low-k) dielectric insulating layer, it will be appreciated that the method of the present invention is equally applicable in producing an improved planarity of the radiation sensitive polymeric layer deposited over protruding substrate surface features such as metal lines and gate electrodes.

In a first embodiment of the present invention a blanket deposited radiation sensitive polymer layer is provided over a substrate. A mask or a reticle including a predetermined density of radiant energy transmitting features is provided to selectively transmit a predetermined radiant energy dosage through the mask to expose selected portions of the radiation sensitive polymer layer thereby producing differential material removal rates over selected thickness portions of the radiation sensitive polymer layer in a subsequent development process. A development process is then carried out to remove selected thickness portions of the radiation sensitive polymer layer to produce an altered thickness topography of the radiation sensitive polymer layer.

Figure 1A:
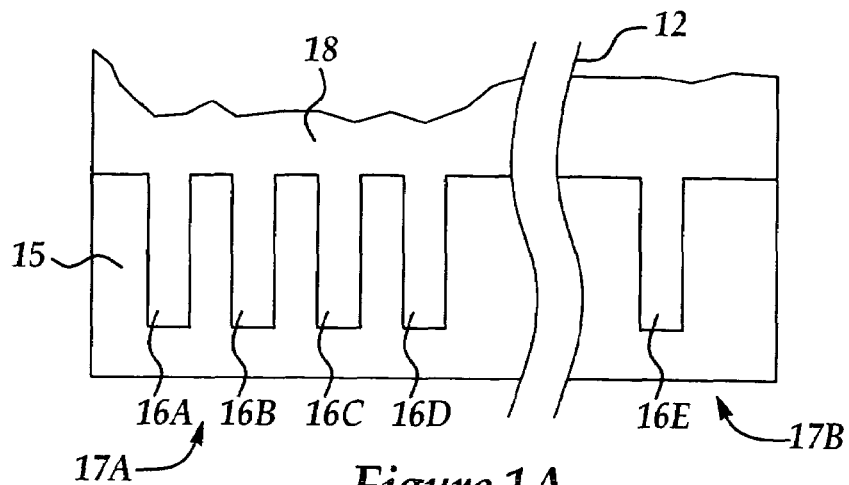
FIGS. 1A-1B are representative cross sectional side views of an exemplary dual damascene manufacturing process at stages in the manufacturing process according to the prior art.
Figure 1B:
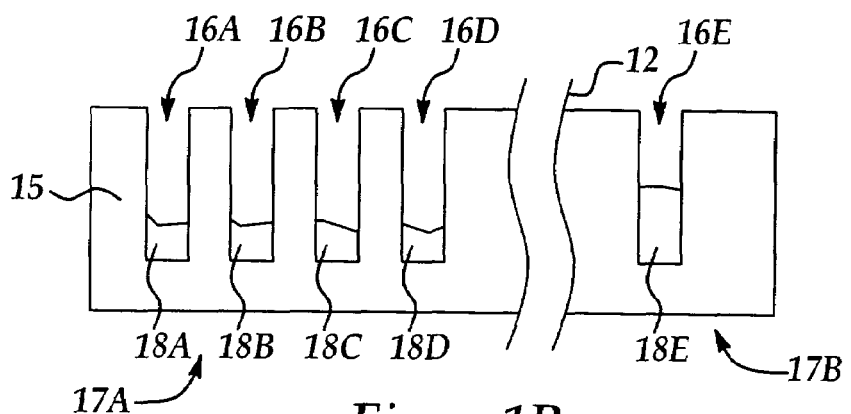
Figure 2A:
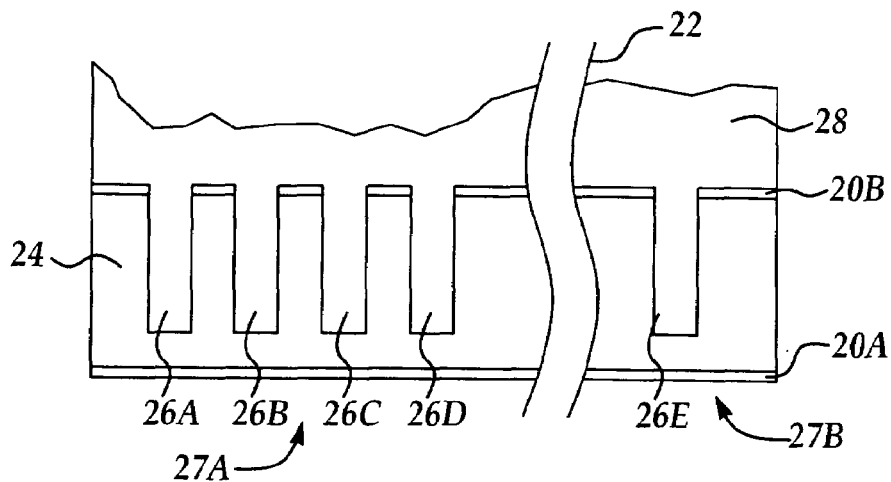
FIGS. 2A-2C are representative cross sectional side views of an exemplary implementation of the present invention in a dual damascene manufacturing process at stages in the manufacturing process according to an embodiment of the present invention.
Figure 2B:
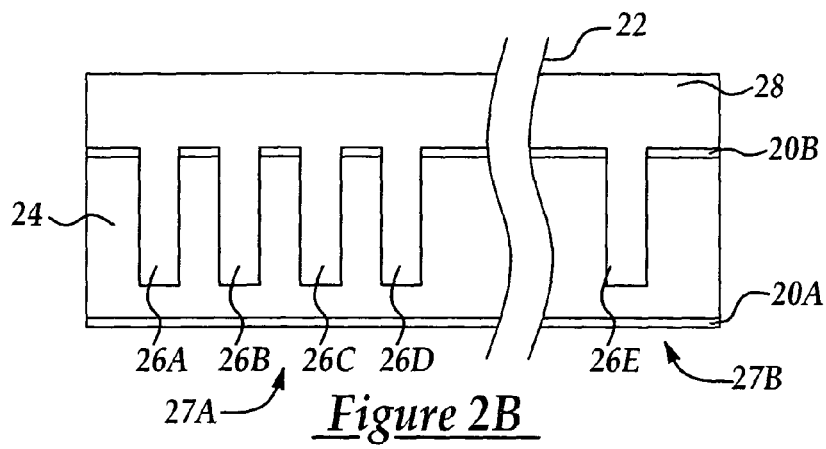
Figure 2C:
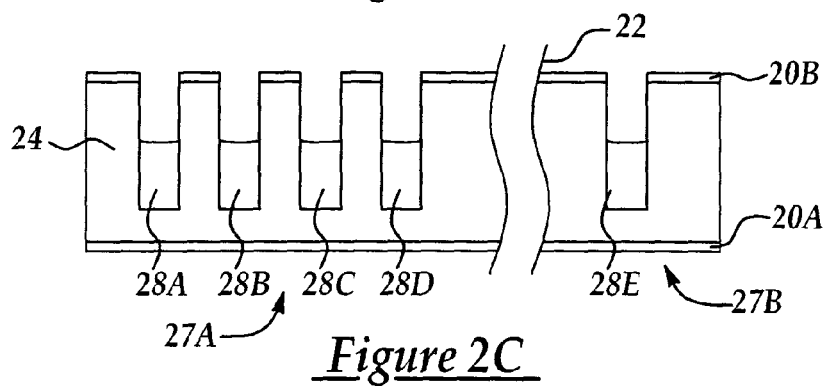

For example, in an exemplary implementation of the present invention, referring to FIGS. 2A-2C, are shown cross sectional side views of portions of a multi-level semiconductor device at stages in a dual damascene manufacturing process. Referring to FIG. 2A, a plurality of Via openings, e.g., 26A, 26B, 26C, 26D are formed in dielectric insulating layer 24 in process wafer area 27A and juxtaposed alongside isolated Via 26E formed in another area of the process wafer e.g., 27B, separated in space on the process wafer as indicated by lines e.g., 22. For example, the dielectric insulating layer 24 may be formed of a low dielectric constant material such as fluorinated silicate glass (FSG) or carbon doped silicate oxide. It will be appreciated that the dielectric insulating layer 24 may be formed of two or more dielectric insulating layers including etch stop layers (not shown) separating the dielectric insulating layers. Also shown, an etch stop layer 20A such as silicon nitride (e.g., $Si_3N_4$) or silicon carbide (e.g., SiC) may be formed underlying the dielectric insulating layer 24 together with an overlying etch stop/bottom anti-reflectance coating (BARC) layer 20B such as silicon oxynitride formed overlying the dielectric insulating layer 24.

Still referring to FIG. 2A, a radiation sensitive polymer layer 28 is blanket deposited by a conventional method such as a spin on process over the wafer process surface (substrate). The radiation sensitive polymer layer 28 is preferably a polymer sensitive to at least one radiant energy source, for example a photosensitive polymer such as a photoresist used in lithographic processes such as UV (ultraviolet), DUV (deep UV), EUV (Extreme UV), X-Ray, electron beam exposure methods such as SCALPEL, and ion projection lithography (IPL). For example, the radiation sensitive polymer layer may be positive or negative acting and preferably includes at least one matrix polymer and at least one modifier polymer whereby the radiation sensitive polymer layer upon exposure to a level of radiant energy has a removal rate in a development process, for example made more or less soluble in a developer solution.

In one embodiment, the modifier copolymer depolymerizes when exposed to radiation and is vapor developable, for example by a self-development or baking development method. Preferably, the matrix polymer is selected such that it does not interfere with the modifier polymer when exposed to radiation, for example avoiding cross-linking at the exposure wavelength. In addition, the matrix polymer is advantageously selected to be compatible with the modifier polymer and provide a sufficiently different removal rate in exposed versus unexposed portions of the radiation sensitive polymer layer in a subsequent development process, for example to obtain an improved surface planarity of the radiation sensitive polymer layer. There are a wide variety of radiation sensitive polymer materials commonly known in the lithography art including at least one matrix polymer and at least one modifier or copolymer, also referred to as resists, which undergo a photochemical change upon exposure to radiant energy thereby altering a material removal rate or material shrinkage rate in a subsequent development process.

Following deposition of the radiation sensitive polymer layer 28, for example a photoresist, including an optional softbake step below a glass transition temperature, the topography of the radiation sensitive polymer layer is measured, for example by interferometry or by profilometry. A radiation dose necessary to achieve a desired topography following a subsequent development process is determined, for example improved photoresist layer planarity. Depending on the development method, for example, chemical dissolution, vaporization, self-development, baking, or ablation, including laser ablation or dry etching, a material removal rate or thickness change rate is preferably determined in response to a radiant energy exposure dose delivered over a selected thickness portion of the radiation sensitive polymer layer. For example, in one embodiment, a height difference of a positive acting resist layer is determined with respect to relatively thinner areas of the resist layer to determine a desired radiation dose to selectively deliver to the relatively thicker areas to thereby increase a dissolution rate of a predetermined thickness portion the relatively thicker areas in a subsequent development process.

For example, in the subsequent development process, development is carried out to remove predetermined thickness portions of the resist layer to improve the planarity of the resist layer.

Figure 3A:
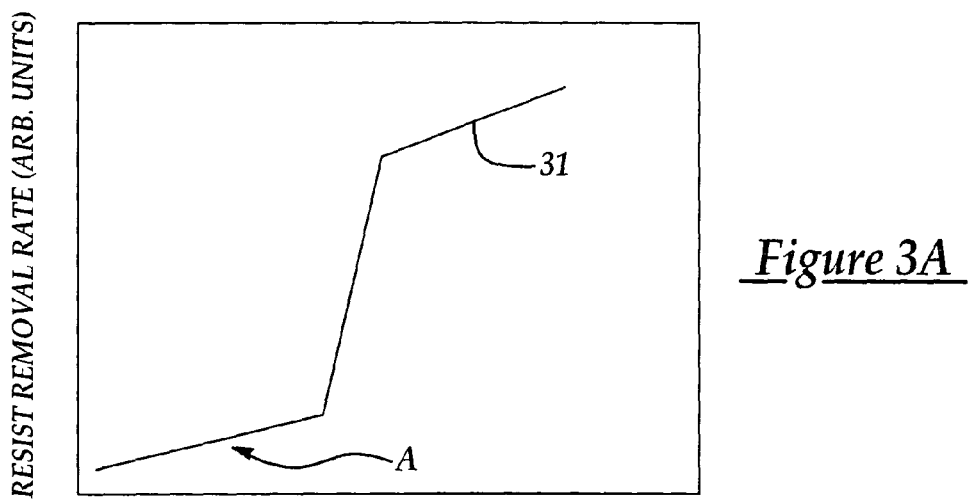
FIG. 3A is a representative data representation of a variation in material removal rate in an exemplary development process versus radiant energy exposure of a radiation sensitive polymer layer employed according to an embodiment of the present invention.

For example, referring to FIG. 3 is shown representative data line 31 of a radiation sensitive polymer layer (e.g., resist layer) removal rate (thickness change rate) shown on the vertical axis versus radiant energy dose (e.g., $mJ/cm^2$) on the horizontal axis. The radiant energy dose within the radiation sensitive polymer layer is determined for example, according to an energy integrator measurement and modified according to calculated or measured constructive and destructive interference occurring within the resist layer caused by reflections from an underlying material layer interface, for example a BARC layer. The radiant energy dose and consequent material removal rate as indicated in data line 31, for example a dissolution rate or dry etching rate, is partially dependent on the thickness of the radiation sensitive polymer layer. For example, if the resist thickness is within a certain thickness window, the resist removal rate will fall within a linear region e.g., area A where the resist removal rate in the development process may be adjusted linearly with an increase or decrease in radiant energy dosage.

For example, in the case where a chemical development process is used, for example using tetra methyl-ammonium hydroxide (TMAH) or the like, the resist removal rate may be determined by a sequential dip, dry and thickness measurement technique following a given radiant energy dose (exposure). More preferably, in-situ laser interferometry is used to determine the dissolution rate, for example by monitoring the reflected light from the underlying layer, for example a BARC or $SiO_2$ containing interface underlying the resist layer. Similar laser interferometry techniques may be used to measure a resist removal rate or resist layer thickness shrinkage rate for other development methods including ablation, self-development, and baking.

Figure 3B:
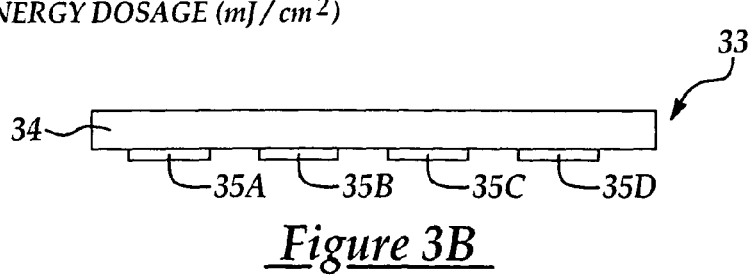
FIG. 3B is a representative cross sectional side views of an exemplary exposure mask according to an embodiment of the invention.

Referring to FIG. 3B, following determination of a desired radiant energy dosage to achieve a desired topography, for example improved planarity of the radiation sensitive polymer layer (resist layer), a controlled radiant energy exposure mask 33, for exposing selected portions of the process surface with the desired radiant energy dosage is formed, for example by mapping a desired radiant energy dosage for relatively thicker portions of the resist layer into a desired transmittance for the controlled radiant energy exposure mask 33. Conventional methods are used to form the controlled radiant energy exposure mask to controllably transmit a radiant energy with the desired radiant energy dosage to selected portions of the photoresist layer. In one embodiment a proximity alignment correction method using a proximity alignment method is used to add desired mask features to achieve a desired transmittance. For example, the mask typically includes a substrate of quartz 34 with features such as phase shifting features and attenuating features e.g., 35A, 35B, 35C, 35D formed at a predetermined density distribution. For example the mask features may include one or more of transparent, semitransparent, and opaque features (e.g., transmittance between about 0 and 1). In a preferred embodiment, the mask features include subresolution features, for example including at least one of lines, holes, islands or any other shaped subresolution feature to controllably alter the transmittance of radiant energy. It will be appreciated subresolution features operate to scatter light in a controlled manner to achieve a desired transmittance while avoiding forming a latent image of the subresolution feature in the resist.

Following forming the controlled radiant energy exposure mask to transmit a predetermined radiant energy dosage, an exposure process is carried out using conventional apparatus and exposure methods. For example, the predetermined radiant energy dosage may be selectively delivered to selected portions of the radiation sensitive polymer layer through the controlled radiant energy exposure mask using conventional alignment and exposure methods. For example, preferably, a step and scan method using one of a mirror projection alignment method, a proximity alignment method, a contact alignment method, and the like, may be used. A step and stitch method may be suitably used as well.

Referring back to FIG. 2B, following controlled exposure to a predetermined radiant energy dosage through the controlled radiant energy exposure mask, the resist layer is developed according to at least one of ablation, vaporization, self-development, baking, and chemical dissolution methods. For example, the topography of the resist layer is controllably altered in a predetermined manner in the development process in response to the selectively introduced differential material removal rates by the radiant energy exposure process, for example between exposed and unexposed portions of the resist layer produced by the predetermined radiant energy dosage delivered through the controlled radiant energy exposure mask. For example, in a process to improve the planarity of the photoresist layer, portions of the resist layer having a relatively greater thickness, for example process wafer areas having a relatively lower density of opening features, for example isolated Via opening 26E in process wafer portion 27B, are selectively exposed to a relatively higher radiant energy dosage to produce a relatively increased dissolution rate in a subsequent developing process thereby selectively removing a relatively greater amount of resist layer 28 thickness portions to produce a resist layer with improved planarity. For example, resist layer 28 is produced having about the same thickness as the resist layer portion overlying process wafer portion 27A having a relatively lower thickness and a higher density of features, for example Via openings 26A, 26B, 26C, 26D.

Referring to FIG. 2C, following the selective radiant energy exposure and development process to improve a planarity of the process surface, an etchback process is carried out to etch back the resist layer 28, for example by a conventional oxygen containing dry etching process to form Vias at least partially filled with resist plugs. e.g., 28A, 28B, 28C, 28D, and 28E, preferably formed at about the same level, for example about a level equal to the depth of a subsequently formed overlying trench. It will be appreciated that the selectively controlled radiant energy exposure method of the present invention advantageously results in a more uniform height of Via plugs over the process wafer surface following the etchback process thereby improving an etching profile in a subsequent overlying trench etching process while avoiding the formation of Via fences formed of etching resistant residues.

Subsequent conventional processes are then carried out to complete the dual damascene structure including a second photolithographic patterning process and etching of overlying trench line openings to overly and encompass one or more Via openings.

In the exemplary embodiment of the present invention shown in FIGS. 2A-2C, the more uniform height of the Via plugs e.g., 28A, 28B, 28C, 28D, and 28E formed following the selectively controlled radiant energy exposure method etchback process of the present invention provides an improved trench etching process whereby at least a predetermined lower portion of the Via openings are protected in the trench etching process thereby avoiding the formation of Via fences and improving a dual damascene opening etching profile. Further, since a resist coater and scanner for exposing the photoresist are in line, the method of the present invention is more cost effective in terms of wafer cycle time compared to an etchback process or CMP process to planarize a resist layer.

Figure 4A:
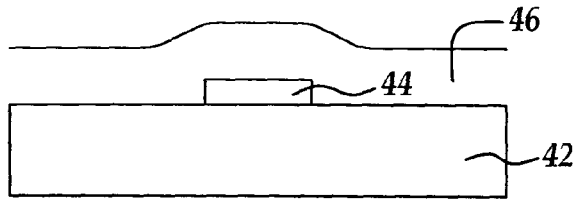
FIGS. 4A and 4B are representative cross sectional side views of an exemplary implementation of the present invention in a semiconductor feature manufacturing process at stages in the manufacturing process according to an embodiment of the present invention.
Figure 4B:
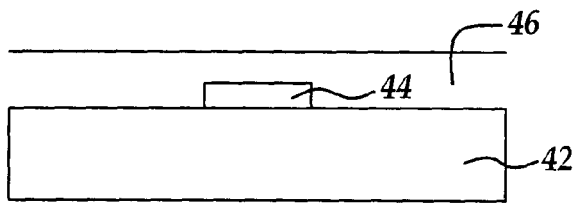

Referring to FIGS. 4A and 4B, a similar process of planarizing a radiation sensitive polymer layer, for example a photoresist layer, overlying a protruding feature is shown. For example, a protruding feature 44 such as a gate electrode or etched metal line is shown protruding from substrate 42. A photoresist layer 46 is blanket deposited over the feature 44 followed by determining a first thickness topography of the photoresist layer 46 and a desired radiant energy dosage, for example DUV light, desired to deliver to the photoresist layer 46 to achieve an improve planarity of photoresist layer 46. Following formation of a controlled radiant energy exposure mask having the desired transmittance properties as explained with respect to the embodiment shown in FIGS. 2A through 2C, the photoresist layer 46 is exposed thorough the controlled radiant energy exposure mask and developed, for example by a chemical dissolution method to remove a thickness portion of the photoresist layer 46 to improve a surface planarity as shown in FIG. 4B. As a result of the improve planarity of the photoresist layer, the resolution and critical dimension of lithographically patterned features in the photoresist layer is improved thereby avoiding the cumulative effect of defocus in a multi-level manufacturing process.

Figure 5:
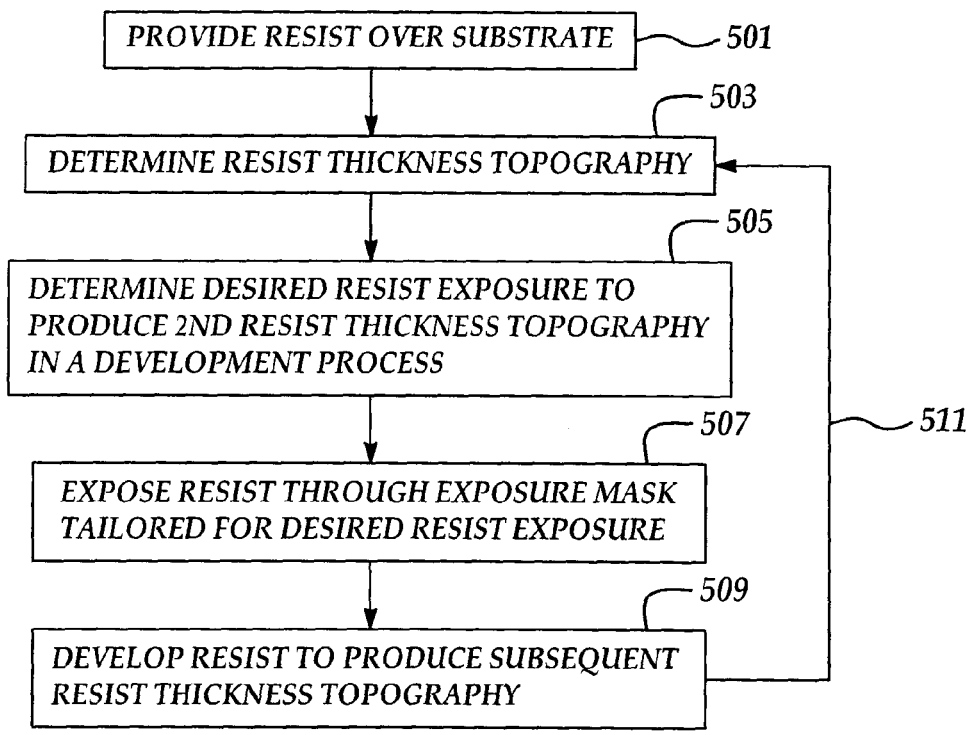
FIG. 5 is an exemplary process flow diagram including several embodiments of the present invention.

Referring to FIG. 5 is shown a process flow diagram including several embodiments of the present invention. In process 501, radiation sensitive polymer layer such as a resist is provided. In process 503, the thickness topography of the resist layer is determined. In process 505, a desired radiant energy exposure (dosage) of the resist layer is determined to produce a subsequent thickness following a development process, for example, to improve a surface planarity. In process 507, the resist is exposed to radiant energy through an exposure mask tailored to have the desired radiant energy exposure (dosage). In process 509, the resist is developed to produce the subsequent thickness topography of the radiation sensitive polymer layer, for example, to improve a surface planarity. As indicated by directional arrow 511, processes 503 through 509 may optionally be repeated.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for selectively planarizing a radiation sensitive polymer layer to improve a subsequent etchback process comprising the steps of:
   providing a substrate comprising a first density of semiconductor features and a second density of semiconductor features wherein said first density is greater than said second density;
   forming at least one radiation sensitive polymer layer having a first thickness topography to cover said semiconductor features;
   measuring a thickness of the first thickness topography;
   determining a radiant energy transmittance distribution based on said measured first thickness topography to produce a second thickness topography;
   exposing the at least one radiation sensitive polymer layer through a mask having said determined radiant energy transmittance distribution to selectively expose said polymer layer over said second density of semiconductor features to a different radiant energy dosage compared to said polymer layer over said first density of semiconductor features;
   developing the at least one radiation sensitive polymer layer to produce said second thickness topography wherein said second thickness topography covers said semiconductor features and has a higher degree of planarity than said first thickness topography; and,
   performing an etchback process of said second thickness topography to produce a third thickness topography having substantially uniform thickness.

2. The method of claim 1, wherein the first thickness topography is determined by a method selected from the group consisting of profilometry, interferometry, and scanning electron microscopy.

3. The method of claim 1, wherein the step of exposing produces a linearly differential material removal rate in the step of developing according to the predetermined radiant energy transmittance distribution.

4. The method of claim 1, wherein the step of developing is selected from the group consisting of ablation, vaporization, self-development, baking, and chemical dissolution.

5. The method of claim 1, wherein the mask comprises subresolution features with a predetermined density distribution.

6. The method of claim 5, wherein the subresolution features are selected from the group consisting of lines, holes and islands.

7. The method of claim 1, wherein the mask comprises semitransparent areas with a predetermined density distribution.

8. The method of claim 1, wherein the semiconductor features comprise at least one of surface protruding and surface penetrating features.

9. The method of claim 8, wherein the surface penetrating features comprise at least one of Via openings and trench openings.

10. The method of claim 8, wherein the surface protruding features comprise at least one of gate electrodes and metal lines.

11. The method of claim 1, wherein the step of exposing is selected from the group consisting of alignment, stepping, and scanning.

12. The method of claim 1, wherein the step of exposing is selected from the group consisting of a step and repeat method, a mirror projection alignment method, a proximity alignment method, a contact alignment method, and a step and stitch exposure method.

13. The method of claim 1, wherein the etchback process produces via plugs within via openings, said via openings formed in a dielectric layer.

14. The method of claim 1, wherein said first thickness is within a thickness window to produce a linear change in thickness with respect to said predetermined radiant energy transmittance distribution in the step of developing.

15. The method of claim 1, wherein said substantially uniform thickness is below an upper surface of said semiconductor features.

16. A method for selectively planarizing a radiation sensitive polymer layer to improve a subsequent etchback process comprising the steps of:
- providing a semiconductor wafer having a process surface comprising a first density of via openings and a second density of via openings formed in a dielectric layer, said first density greater than said second density;
- blanket depositing a radiation sensitive polymer layer to fill and cover said via openings at a first thickness;
- measuring a thickness topography of the radiation sensitive polymer layer;
- determining a desired radiant energy dosage based on said measured first thickness topography to deliver to portions of the radiation sensitive polymer layer to produce a subsequent planarized thickness topography of the radiation sensitive polymer layer;
- providing an exposure mask for delivering the desired radiant energy dosage;
- selectively exposing portions of the radiation sensitive polymer layer through the exposure mask to deliver the desired radiant energy dosage including a relatively higher radiant energy dosage to an area of said polymer layer overlying said second density;
- developing the radiation sensitive polymer layer to produce the subsequent planarized thickness topography wherein said planarized thickness topography comprises a thickness portion above and covering said via openings; and,
- performing an etchback process of said planarized thickness topography to form via plugs at a substantially uniform height within said via openings.

17. The method of claim 16, wherein the step of exposing produces linearly differential radiation sensitive polymer layer thickness change rates in the step of developing according to the desired radiant energy dosage.

18. The method of claim 16, wherein the step of developing is selected from the group consisting of ablation, vaporization, self-development, baking, and chemical dissolution.

19. The method of claim 16, wherein the exposure mask comprises subresolution features with a predetermined density distribution.

20. The method of claim 16, wherein the exposure mask comprises semitransparent areas with a predetermined density distribution.

21. The method of claim 16, wherein the steps of determining a thickness topography through the step of developing the radiation sensitive polymer layer are repeated to form said subsequent planarized thickness topography.

22. The method of claim 16, wherein said first thickness is within a thickness window to produces a linear change in thickness with respect to said desired radiant energy dosage in the step of developing.

23. The method of claim 16, wherein the first thickness topography is determined by a method selected from the group consisting of profilometry, interferometry, and scanning electron microscopy.

24. A method for selectively planarizing a radiation sensitive polymer layer to improve a subsequent etchback process comprising the steps of:
- providing a substrate comprising a first and second density of semiconductor features;
- forming a radiation sensitive polymer layer having a first thickness topography to cover said semiconductor features;
- measuring said first thickness topography according to a method selected from the group consisting of profilometry, interferometry, and scanning electron microscopy;
- determining a desired radiant energy dosage of said polymer layer based on said measured first thickness topography to produce a second thickness topography in a subsequent development process;
- exposing the radiation sensitive polymer layer through a mask to provide said desired radiant energy dosage;
- developing the radiation sensitive polymer layer in said subsequent development process to produce said second thickness topography wherein said second thickness topography has a higher degree of planarity than said first thickness topography; and
- etching back said second thickness topography to form a third thickness topography having a substantially uniform thickness.

* * * * *